(12) United States Patent
Lim et al.

(10) Patent No.: US 6,829,189 B2
(45) Date of Patent: Dec. 7, 2004

(54) SEMICONDUCTOR MEMORY DEVICE AND BIT LINE SENSING METHOD THEREOF

(75) Inventors: Kyu-Nam Lim, Suwon (KR); Jei-Hwan Yoo, Suwon (KR); Young-Gu Kang, Hanam (KR); Jae-Yoon Shim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/290,284

(22) Filed: Nov. 8, 2002

(65) Prior Publication Data

US 2003/0090950 A1 May 15, 2003

(30) Foreign Application Priority Data

Nov. 15, 2001 (KR) ......................................... 2001-71144

(51) Int. Cl.[7] ............................. G11C 7/00; G11C 7/02; G11C 8/00
(52) U.S. Cl. ...................... 365/205; 365/196; 365/203; 365/207; 365/189.09; 365/194; 365/233; 365/189.07
(58) Field of Search ........................... 365/205, 189.07, 365/189.09, 194, 196, 203, 207, 233, 202

(56) References Cited

U.S. PATENT DOCUMENTS

| | | | | |
|---|---|---|---|---|
| 5,444,662 A | * | 8/1995 | Tanaka et al. | 365/203 |
| 5,646,900 A | * | 7/1997 | Tsukude et al. | 365/205 |
| 5,917,744 A | * | 6/1999 | Kirihata et al. | 365/63 |
| 5,953,277 A | * | 9/1999 | Mukunoki et al. | 365/210 |
| 6,016,279 A | * | 1/2000 | Chi | 365/203 |
| 6,130,845 A | * | 10/2000 | Ootsuki et al. | 365/190 |
| 6,141,259 A | * | 10/2000 | Scott et al. | 365/189.06 |
| 6,151,237 A | * | 11/2000 | Naritake | 365/63 |
| 6,154,402 A | | 11/2000 | Akita | 365/203 |
| 6,337,824 B1 | * | 1/2002 | Kono et al. | 365/207 |
| 6,418,067 B1 | * | 7/2002 | Watanabe et al. | 365/200 |
| 2001/0033508 A1 | * | 10/2001 | Waller | 365/49 |
| 2002/0000838 A1 | * | 1/2002 | Matano | 327/52 |
| 2003/0206463 A1 | * | 11/2003 | Fujino et al. | 365/200 |

OTHER PUBLICATIONS

IEEE Journal of Solid State Circuits, vol. 32, No. 11, Nov. 1997, pp. 1721–1727.

* cited by examiner

Primary Examiner—David Nelms
Assistant Examiner—Ly Duy Pham
(74) Attorney, Agent, or Firm—Lee & Sterba, P.C.

(57) ABSTRACT

In a semiconductor memory device, a circuit for controlling a voltage level applied to a bit line isolation circuit preferably includes a memory cell connected between a cell bit line pair and a word line; a bit line pre-charge circuit; a sense amplifier bit line pre-charge circuit; a charge transfer circuit connected between the cell bit line pair and the sense amplifier bit line pair; a first sense amplifier circuit for amplifying a voltage of the sense amplifier bit line pair to a first voltage in response to a first control signal; and a second sense amplifier circuit for amplifying the voltage of the sense amplifier bit line pair to a second voltage in response to a second control signal. The combination of the two-stage sense amplifier ciruitry allows for the accurate determination of minimally-different logical voltage levels and minimized circuit area.

17 Claims, 8 Drawing Sheets

SEMICONDUCTOR MEMORY DEVICE AND BIT LINE SENSING METHOD THEREOF

BACKGROUND OF THE INVENTION

1. Field of the Invention

The present invention relates to a semiconductor memory device and a bit line sensing method. More particularly, the present invention relates to a semiconductor memory device that may be operated at a low power voltage.

2. Description of the Related Art

In a semiconductor memory device, a charge transfer pre-sensing (CTPS) function is typically used to improve a sensing margin of a lower power voltage.

Figure 1:
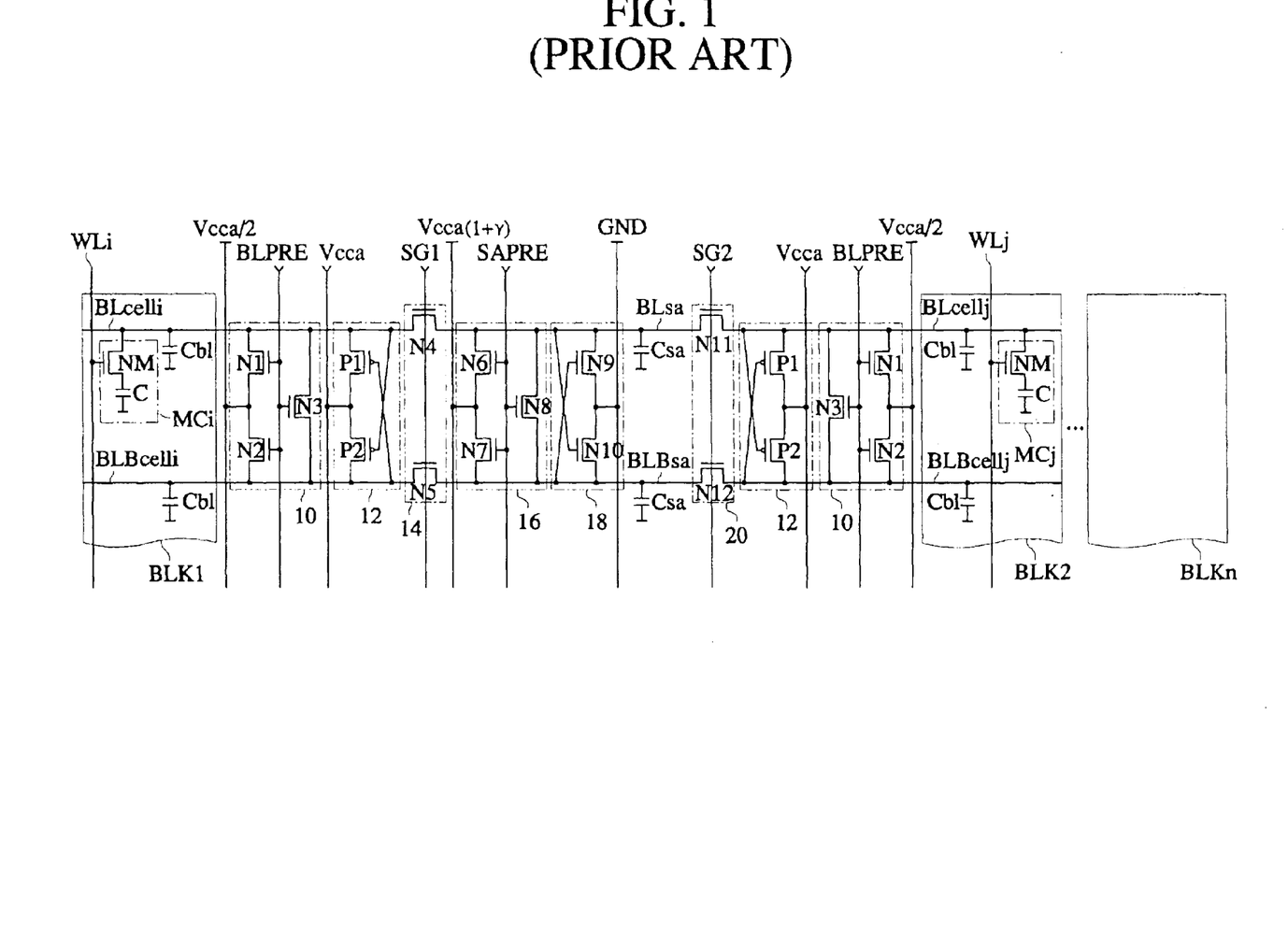
FIG. 1 illustrates a circuit diagram of a conventional semiconductor memory device having a charge transfer pre-sensing scheme.

FIG. 1 illustrates a circuit diagram of a conventional semiconductor memory device having a charge transfer pre-sensing scheme. This conventional semiconductor memory device includes a cell bit line pre-charge circuit 10, a PMOS sense amplifier 12, a sense amplifier bit line pre-charge circuit 16, an NMOS sense amplifier 18, first and second bit line isolation circuits 14 and 20, respectively, and memory cells MCi and MCj.

The memory cell MCi represents a representative memory cell among memory cells arranged in a memory cell array block BLK1 among n-number of memory cell array blocks BLK1 to BLKn. Similarly, memory cell MCj represents a representative memory cell among memory cells arranged in the memory cell array block BLK2. A capacitor Cb1 represents a cell bit line load capacitor, and a capacitor Csa represents a sense amplifier bit line load capacitor.

NMOS transistors N1, N2 and N3 of the cell bit line pre-charge circuit 10 are turned on in response to a control signal BLPRE having a logic "high" level to pre-charge the cell bit line pair BLcelli and BLBcelli to a voltage Vcca/2. PMOS transistors P1 and P2 of the PMOS sense amplifier 12 are turned on in response to a voltage of the cell bit line pair BLBcelli and BLcelli having a logic "low" level to amplify a voltage of the bit line pair BLcelli and BLBcelli having a logic "high" level to a voltage Vcca. NMOS transistors N4 and N5 of the first bit line isolation circuit 14 are turned on in response to a control signal SG1 to electrically connect the cell bit line pair BLcelli and BLBcelli to the sense amplifier bit line pair BLsa and BLBsa, respectively. NMOS transistors N6, N7 and N8 of the sense amplifier bit line pre-charge circuit 16 are turned on in response to a control signal SAPRE having a logic "high" level to pre-charge the sense amplifier bit line pair BLsa and BLBsa to a voltage Vcca. NMOS transistors N9 and N10 of the NMOS sense amplifier 18 are turned on in response to a voltage of the sense amplifier bit line pair BLsa and BLBsa having a logic "low" level to make the voltage of the sense amplifier bit line pair BLsa and BLBsa a ground voltage. NMOS transistors N11 and N12 of the second bit line isolation circuit 20 are turned on in response to a control signal SG2 to electrically connect the cell bit line pair BLcellj and BLBcellj to the sense amplifier bit line pair BLsa and BLBsa, respectively.

Figure 2:
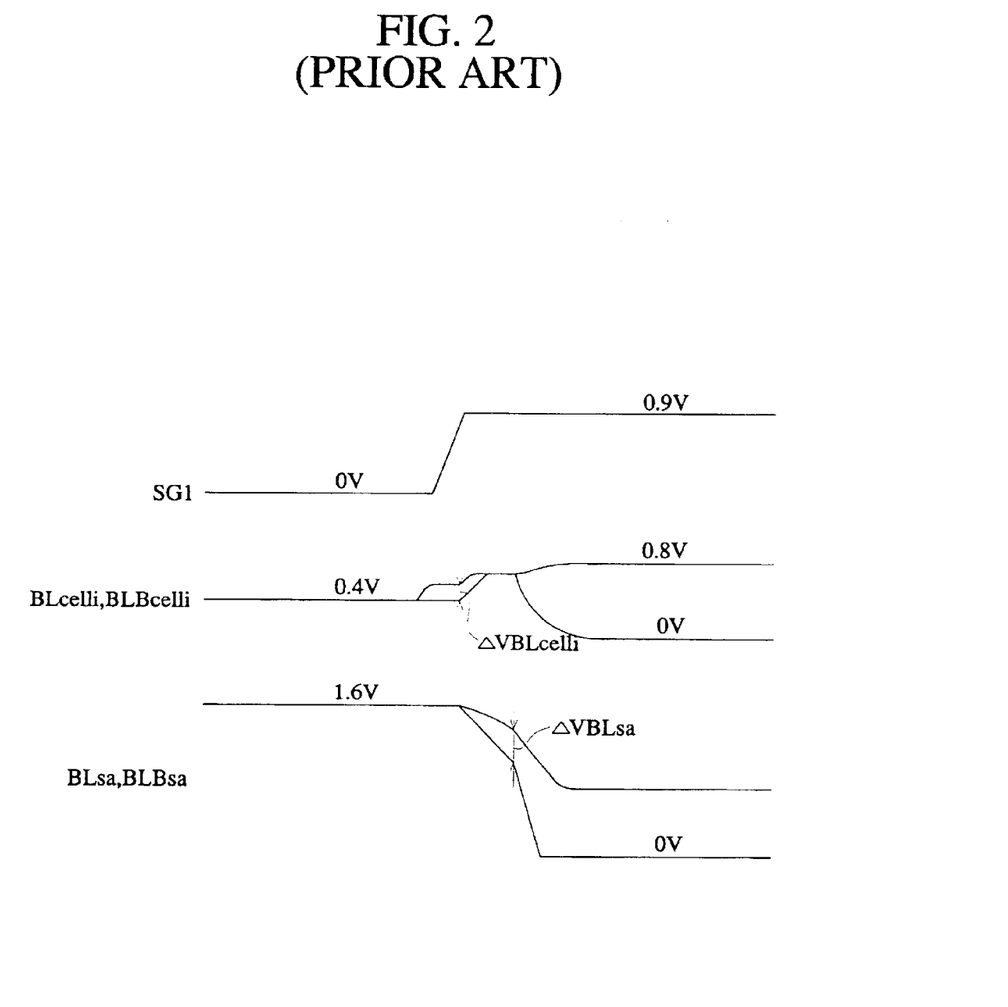
FIG. 2 is a timing diagram illustrating an operation of the semiconductor memory device of FIG. 1.

Operation of the semiconductor memory device of FIG. 1 is described below with reference to FIG. 2, in which a timing diagram illustrating an operation of the semiconductor memory device of FIG. 1 is shown. In FIG. 2, a data is read from the memory cell array block BLK, and a cell array voltage Vcca is 0.8 volts.

A pre-charging operation is initiated with the application of the control signals BLPRE, SAPRE, SG1 and SG2. The activating voltage level for SG1 and SG2 is 0 volts. The NMOS transistors N4 and N5 are turned off to electrically separate the sense amplifier bit line pair BLsa and BLBsa from the cell MCi bit line pair BLcelli and BLBcelli, and the NMOS transistors N11 and N12 are turned off to electrically separate the sense amplifier bit line pair BLsa and BLBsa from the cell MCj bit line pair BLcelli and BLBcelli. The NMOS transistors N1 to N3 are turned on to pre-charge the cell bit line pair BLcelli and BLBcelli to a voltage Vcca/2 (=0.4 volts). The NMOS transistors N6, N7 and N8 are turned on to pre-charge the sense amplifier bit line pair BLsa and BLBsa to a voltage Vcca(1+γ) (=1.6 volts).

Then, when a read command is applied to select word line WLi, the NMOS transistor NM of the memory cell MCi connected to the word line WLi is turned on, and a charge sharing operation is performed between a capacitor C and the cell bit line pair BLcelli and BLBcelli. This causes a voltage difference ΔVBLcell to occur between the cell bit line pair.

When the control signal SG1 is activated with a voltage of 0.9 volts, the NMOS transistors N4 and N5 are turned on and a charge transfer operation is performed between the cell bit line pair BLcelli and BLBcelli and the sense amplifier bit line pair BLsa and BLBsa. Hence, a voltage of the sense amplifier bit line pair BLsa and BLBsa is lowered, and a voltage difference occurs between the sense amplifier bit line pair BLsa and BLBsa, as governed by the equation:

$$\Delta VBLsa (=\Delta V \times (Cb1+Csa)/Csa). \quad [1]$$

As the voltage of the sense amplifier bit line pair BLsa and BLBsa decreases, the voltage of the cell bit line pair BLcelli and BLBcelli increases, and the voltage difference between the cell bit line pair BLcelli and BLBcelli, ΔVBLcelli, is steadily lowered to 0 volts. Thereafter, when the voltage difference ΔVBLsa occurs between the sense amplifier bit line pair BLsa and BLBsa, the PMOS sense amplifier 12 and the NMOS sense amplifier 18 operate to amplify the voltage of the cell bit line BLcelli and the sense amplifier bit line BLsa to Vcca, and the voltage of the cell bit line BLBcelli, and the sense amplifier bit line BLBsa to 0 volts.

However, the semiconductor memory device of FIG. 1 has a problem in that it is difficult to set a level of the control signal SG1, which is governed by the inequality [2]:

$$\frac{1}{2} Vcca \left( 1 + \frac{1}{1+\frac{Cb1+Cs}{Cs}} \right) \leq$$

$$VSG1 - Vth \leq \frac{Vcca(1+\gamma)Csa + \left(\frac{1}{2}Vcca\right)Cb1}{Cb1+Cs+Csa} + 0.05$$

where VSG1 denotes a voltage of the control signal SG1 and Vth denotes a threshold voltage of the NMOS transistors N4 and N5.

A left member of the inequality is a lower limit of a voltage of the control signal SG1, and a right member of the inequality is an upper limit of a voltage of the control signal SG1. A voltage of the control signal SG1 is at least higher by a threshold voltage Vth than a data having a logic "high" level, and is at least lower by a threshold voltage Vth than a data having a logic "low" level. That is, the left member and the right member of the inequality are the upper limit and the lower limit, respectively, when NMOS transistors N4 and N5 operate in a saturation region rather than in a linear region to perform a charge transfer operation.

In order to increase a voltage margin of the control signal SG1, the pre-charge voltage has to be greater than a voltage Vcca with γ having a value of about 1. Assume that the capacitor C has a capacitance of 20 fF, the capacitor Cb1 has a capacitance of 120 fF, the voltage Vcca has a voltage of 0.8 volts, and a threshold voltage has a voltage of 0.4 volts. If the values are substituted in the inequality, the voltage VSG1 of the control signal SG1 is bounded by 0.85 volts or more and 0.95 volts or less. Thus, the voltage VSG1 has a very small margin of 0.1 volts. Therefore, it is very difficult to accurately set a level of the control signal SG1.

In addition, the semiconductor memory device of FIG. 1 has a problem in that the PMOS sense amplifier 12 is not shared between the respective memory cell array blocks but is separately configured, thereby increasing a layout area size. Furthermore, since the sense amplifier bit line pair BLsa and BLBsa have to be pre-charged to be higher than a voltage Vcca during the pre-charge operation, power consumption is high.

Figure 3:
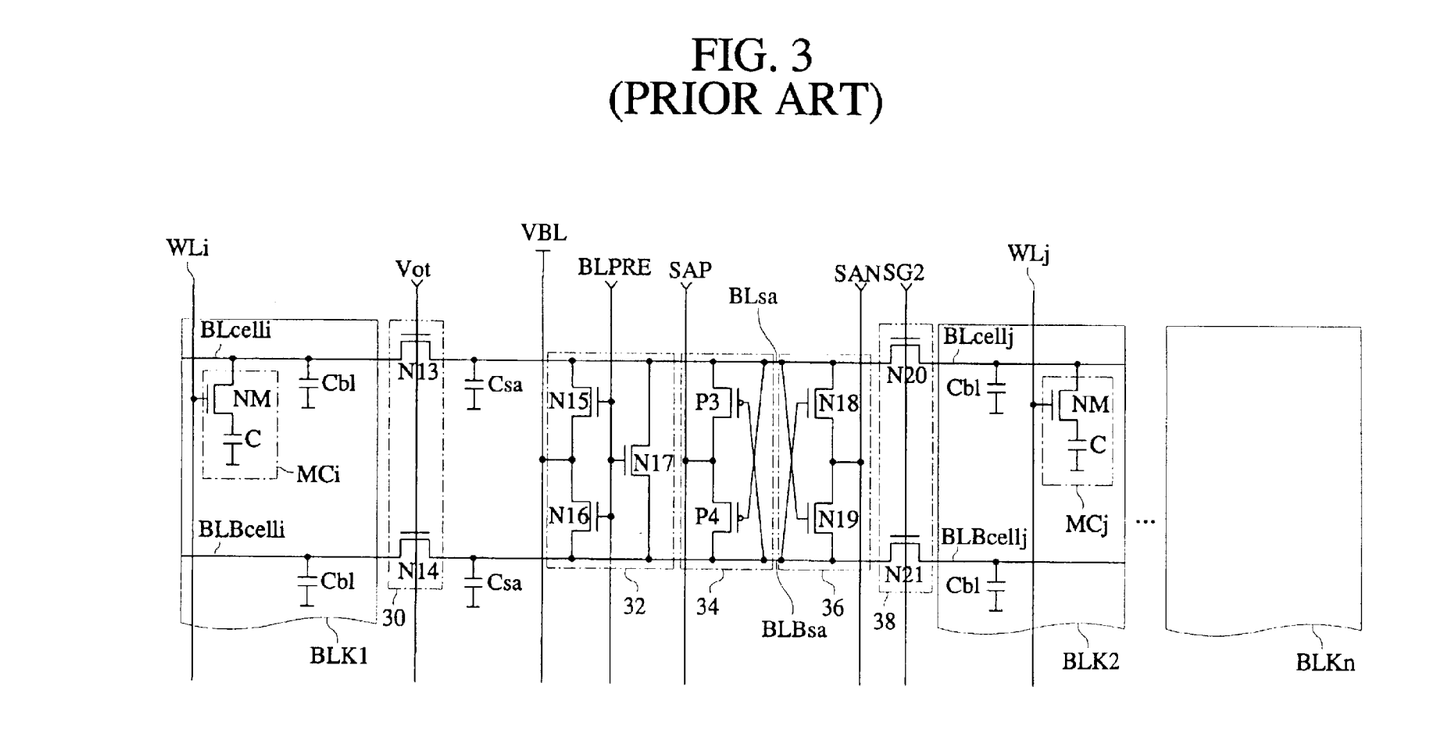
FIG. 3 illustrates a circuit diagram of another conventional semiconductor memory device having a charge transfer pre-sensing scheme.

FIG. 3 illustrates a circuit diagram of another conventional semiconductor memory device having a charge transfer pre-sensing scheme. The semiconductor memory device of FIG. 3 includes first and second bit line isolation circuits 30 and 38, a pre-charge circuit 32, a PMOS sense amplifier 34 and an NMOS sense amplifier 36, and memory cells MCi and MCj. As in the memory device shown in FIG. 1, the memory cells MCi and MCj represent representative memory cells among memory cells arranged in a memory cell array block BLK1 and BLK2, respectively, among n-number of memory cell array blocks BLK1 to BLKn. Capacitor Cb1 represents a cell bit line load capacitor, and capacitor Csa represents a sense amplifier bit line load capacitor.

NMOS transistors N13 and N14 of the first bit line isolation circuit 30 are turned on in response to a control signal Vot to electrically connect the cell bit line pair BLcelli and BLBcelli to the sense amplifier bit line pair BLsa and BLBsa. NMOS transistors N15 to N17 of the pre-charge circuit 32 are turned on in response to a control signal BLPRE to pre-charge the cell bit line pair BLcelli and BLBcelli and the sense amplifier bit line pair BLsa and BLBsa to a voltage VBL. When a sense amplifier enable signal SAP having a voltage level Vcc is applied, PMOS transistors P3 and P4 of the PMOS sense amplifier 34 are turned on in response to a signal of the sense amplifier bit line pair BLsa and BLBsa having a logic "low" level to amplify a signal of the sense amplifier bit line pair BLsa and BLBsa having a logic "high" level to a voltage Vcc. When a sense amplifier enable signal SAN having a voltage level of 0 volts is applied, NMOS transistors N18 and N19 of the NMOS sense amplifier 36 are turned on in response to a signal of the sense amplifier bit line pair BLsa and BLBsa having a logic "high" level to amplify a signal of the sense amplifier bit line pair BLsa and BLBsa having a logic "low" level to a voltage of 0 volts. NMOS transistors N20 and N21 of the second bit line isolation circuit 38 are turned on in response to a control signal SG2 to electrically connect the cell bit line pair BLcellj and BLBcellj to the sense amplifier bit line pair BLsa and BLBsa.

Figure 4:
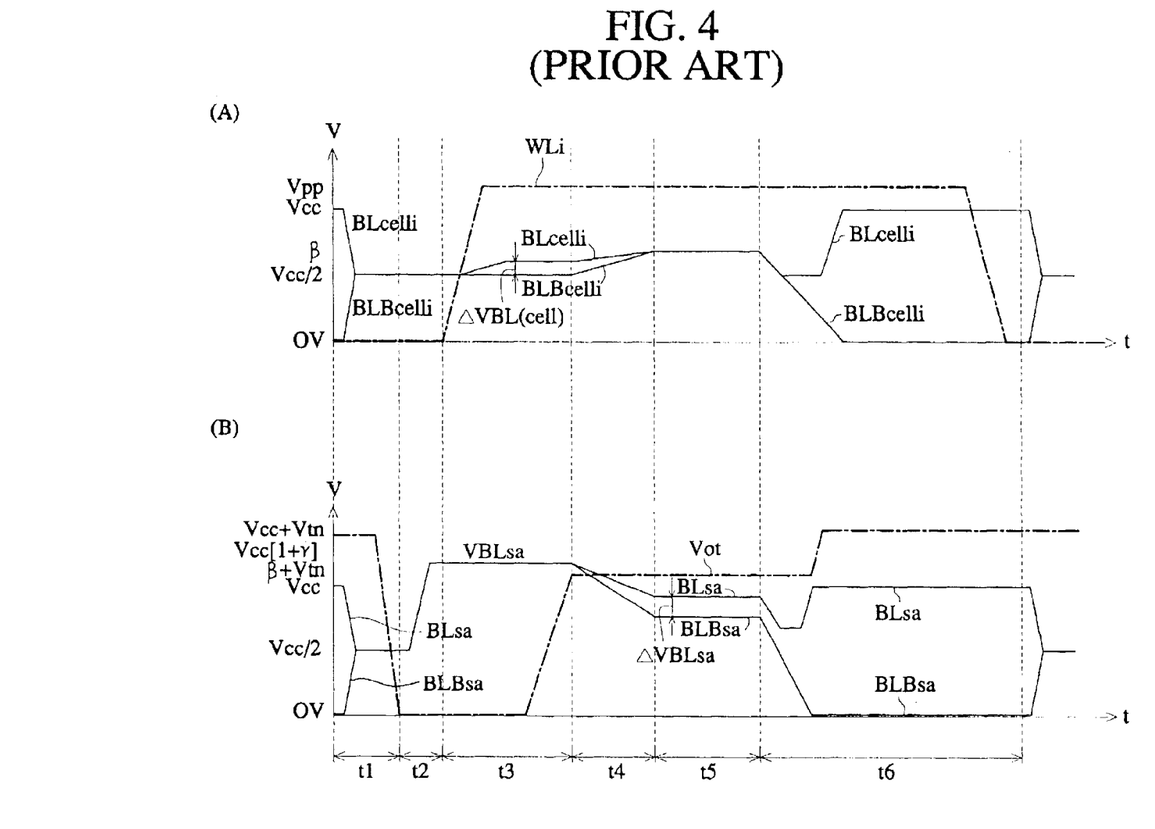
FIG. 4 illustrates timing diagrams (A) and (B), which illustrate an operation of the semiconductor memory device of FIG. 3.

Operation of the semiconductor memory device of FIG. 3 is described below with reference to the timing diagrams (A) and (B), as shown in FIG. 4. In particular, in FIG. 4, (A) is a timing diagram that relates to the operation of a cell bit line pair portion of the semiconductor memory device of FIG. 3, and (B) is a timing diagram that relates to the operation of a sense amplifier bit line pair of the semiconductor memory device of FIG. 3. In FIG. 4, a data is read from the memory cell array block BLK1.

During a time period t1, upon the application of a control signal Vot having a voltage level "Vcc+Vtn", a control signal BLPRE having a logic "high" level, and a voltage VBL having a level Vcc/2, the NMOS transistors N15, N16 and N17 are turned on to pre-charge the sense amplifier bit line pair BLsa and BLBsa to a voltage Vcc/2. The NMOS transistors N13 and N14 are turned on to transfer charges from the sense amplifier bit line pair BLsa and BLBsa to the cell bit line pair BLcelli and BLBcelli, thereby pre-charging the cell bit line pair BLcelli and BLBcelli to a voltage Vcc/2.

During a time period t2, when the control signal Vot having a voltage level of 0 volts and the voltage VBL having a voltage level Vcc(1+γ) are applied, the NMOS transistors N13 and N14 are turned off, such that the sense amplifier bit line pair BLsa and BLBsa is pre-charged to a voltage Vcc(1+γ). During a time period t3, when a high voltage VPP is applied to the word line WLi, NMOS transistor NM of the memory cell MCi is turned on, such that a voltage difference ΔVBLcell occurs between the cell bit line pair BLcelli and BLBcelli.

During a time period t4, when the control signal Vot having a voltage level "β+Vtn" is applied, the NMOS transistors N13 and N14 are turned on. A voltage of the cell bit line pair BLcelli and BLBcelli is raised to a voltage β (=Vot−Vtn), such that a voltage difference between the cell bit line pair BLcelli and BLBcelli becomes 0 volts. A voltage of the sense amplifier bit line pair BLsa and BLBsa is steadily lowered, so that a voltage difference ΔVBLsa occurs. During a time period t5, when a voltage difference of the cell bit line pair BLcelli and BLBcelli and the sense amplifier bit line pair BLsa and BLBsa is lowered below a threshold voltage Vtn of the NMOS transistors N13 and N14, the NMOS transistors N13 and N14 are turned off, thereby opening the connection between the cell bit line pair BLcelli and BLBcelli and the sense amplifier bit line pair BLsa and BLBsa.

During a time period t6, when the sense amplifier enable signals SAP and SAN, which have a voltage Vcc and a voltage of 0 volts respectively, are applied, the NMOS sense amplifier 34 and the PMOS sense amplifier 36 operate to amplify a voltage of the sense amplifier bit line pair BLsa and BLBsa to a voltage of Vcc and 0 volts, respectively. At this time, when the control signal Vot is transited to a voltage level "Vcc+Vtn", the NMOS transistors N13 and N14 are turned on, and the voltage of the sense amplifier bit line pair BLsa and BLBsa is transferred to the cell bit line pair BLcelli and BLBcelli. Therefore, a voltage of the cell bit line pair BLcelli and BLBcelli is also amplified to a voltage of Vcc and 0 volts, respectively.

However, the semiconductor memory device of FIG. 3 has a layout area size smaller than that of FIG. 1, and the voltage level of the control signal Vot applied to the NMOS transistors of the bit line isolation circuit has to be varied from Vcc+Vtn to 0 volts, from 0 volts to β+Vtn, and from β+Vtn to Vcc+Vtn, and a voltage level of the voltage VBL also has to be varied from Vcc/2 to Vcc(1+γ), and from Vcc(1+γ) to Vcc/2. Disadvantageously, it is also very difficult to accurately control such voltage levels.

SUMMARY OF THE INVENTION

In an effort to overcome the problems described above, it is a feature of an embodiment of the present invention to provide a semiconductor memory device and a bit line sensing method capable of controlling a bit line sensing operation without increasing a layout area size.

A preferred embodiment of the present invention provides a semiconductor memory device including a memory cell connected between a cell bit line pair and a word line; a bit line pre-charge circuit connected to the cell bit line pair for pre-charging the cell bit line pair to a voltage lower than a first voltage in response to a cell bit line pre-charge control signal; a sense amplifier bit line pre-charge circuit connected to a sense amplifier bit line pair for pre-charging the sense amplifier bit line pair to the first voltage in response to a sense amplifier bit line pre-charge control signal; a charge transfer circuit connected between the cell bit line pair and the sense amplifier bit line pair for transferring charges to the cell bit line pair and the sense amplifier bit line pair in response to a control signal; a first sense amplifier circuit connected between the sense amplifier bit line pair for amplifying a voltage of the sense amplifier bit line pair to the first voltage; and a second sense amplifier circuit connected between the sense amplifier bit line pair for amplifying a voltage of the sense amplifier bit line pair to a second voltage in response to a sense amplifier enable signal.

The control signal may be maintained at the second voltage, and may be transited to the first voltage before the sense amplifier enable signal is generated after an active command is applied, and may be transited from the first voltage to a third voltage after the sense amplifier enable signal is generated. The control signal is generated by a signal generating circuit and a control signal, wherein the signal generating circuit preferably includes: a first delay circuit having the same line load as a word line enable signal for enabling the word line, and receiving and delaying the active command; a second delay circuit delaying an output signal of the first delay circuit by a first time to generate a first signal; and a third delay circuit delaying the output signal of the first delay circuit by a second time to generate a second signal, wherein the control signal generating circuit generates the control signal having the first voltage in response to the first signal, and generates the control signal having the third voltage in response to the second signal.

The voltage lower than the first voltage is preferably the first voltage/2. The first voltage may be an internal or an external power voltage. The second voltage may be a ground voltage. The third voltage may be a high voltage higher than the power voltage.

The sense amplifier bit line pre-charge circuit preferably includes first and second PMOS transistors serially connected between the sense amplifier bit line pair and having a common source receiving the first voltage and a gate receiving the sense amplifier bit line pre-charge control signal. The first sense amplifier circuit preferably includes third and fourth PMOS transistors serially connected between the sense amplifier bit line pair and having a gate connected to the sense amplifier bit line pair and a common source receiving the first voltage. The first sense amplifier circuit preferably includes third and fourth PMOS transistors serially connected between the sense amplifier bit line pair and having a gate connected to the sense amplifier bit line pair and a common source receiving the first voltage in response to the sense amplifier enable signal. The second sense amplifier circuit preferably includes first and second NMOS transistors serially connected between the sense amplifier bit line pair and having a gate connected to the sense amplifier bit line pair and a common source receiving the second voltage in response to the sense amplifier enable signal.

A preferred embodiment of the present invention also provides a bit line sensing method of a semiconductor memory device including separating a cell bit line pair from a sense amplifier bit line pair when a control signal of a first voltage is applied, pre-charging the cell bit line pair to a voltage lower than the first voltage, and pre-charging the sense amplifier bit line pair to the first voltage when a sense amplifier bit line pre-charge control signal is applied; generating a voltage difference between the cell bit line pair by enabling a word line and selecting a memory cell; generating a first voltage difference between the cell bit line pair by connecting the cell bit line pair to the sense amplifier bit line pair when the control signal having the second voltage is applied, and generating a second voltage difference between the sense amplifier bit line pair by reducing a voltage of the sense amplifier bit line pair; maintaining a voltage of the cell bit line pair and the sense amplifier bit line pair to a certain voltage; and amplifying the sense amplifier bit line pair to the first voltage and the second voltage by enabling the PMOS sense amplifier and the NMOS sense amplifier, and transferring a voltage of the sense amplifier bit line pair to the cell bit line pair when the control signal having the third voltage is applied.

The voltage lower than the first voltage may be the first voltage/2. The first voltage may be an internal power voltage or an external power voltage. The second voltage may be a ground voltage. The third voltage may be a high voltage higher the power voltage.

BRIEF DESCRIPTION OF THE DRAWINGS

These and other features and advantages of the present invention will be readily apparent to those of ordinary skill in the art upon review of the detailed description that follows when taken in conjunction with the accompanying drawings, in which like reference numerals denote like parts, and in which.

DETAILED DESCRIPTION OF THE INVENTION

Korean Patent Application No. 2001-71144, filed Nov. 15, 2001, and entitled: "Semiconductor Memory Device and Bit Line Sensing Method Thereof," is hereby incorporated by reference in its entirety.

Reference will now be made in detail to preferred embodiments of the present invention, an example of which is illustrated in the accompanying drawings.

Figure 5:
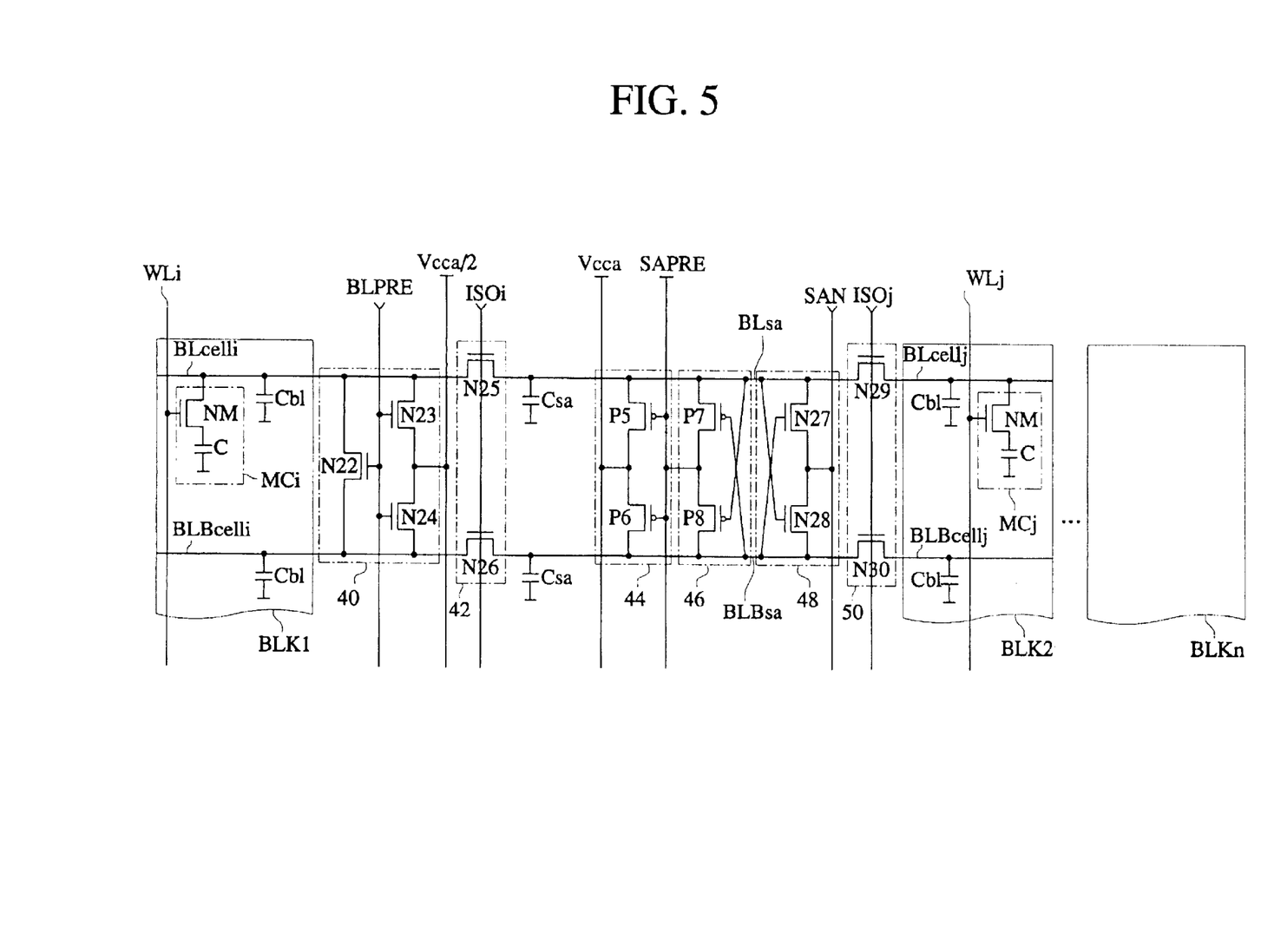
FIG. 5 illustrates a circuit diagram of a semiconductor memory device according to the present invention.

FIG. 5 illustrates a circuit diagram of a semiconductor memory device according to the present invention. The semiconductor memory device of FIG. 5 preferably includes a cell bit line pre-charge circuit 40 connected between cell bit line pair BLcelli and BLBcelli, a sense amplifier bit line pre-charge circuit 44, a PMOS sense amplifier 46 and an NMOS sense amplifier 48, which are connected between sense amplifier bit line pair BLsa and BLBsa, and charge transfer circuits or bit line isolation circuits 42 and 50 connected between the sense amplifier bit line pair BLsa-BLBsa and the cell bit line pairs BLcelli-BLBcelli and BLcellj-BLBcellj, respectively.

Memory cells MCi and MCj represent representative memory cells among memory cells arranged in memory cell array blocks BLK1 and BLK2, respectively, among n-number of memory cell array blocks BLK1 to BLKn. A capacitor Cb1 represents a cell bit line load capacitor, and a capacitor Csa represents a sense amplifier bit line load capacitor.

The cell bit line pre-charge circuit 40 includes NMOS transistors N22, N23 and N24. The NMOS transistor N22 is connected between the cell bit line pair BLcelli and BLBcelli and has a gate receiving a control signal BLPRE. The NMOS transistors N23 and N24 are serially connected between the cell bit line pair BLcelli and BLBcelli and have a gate receiving the control signal BLPRE and a common source receiving a pre-charge voltage Vcca/2. The sense amplifier bit line pre-charge circuit 44 has PMOS transistors P5 and P6. The PMOS transistors P5 and P6 are serially connected between the sense amplifier bit line pair BLsa and BLBsa and have a gate receiving a control signal SAPRE and a common source receiving a first voltage Vcca. The PMOS sense amplifier 46 has PMOS transistors P7 and P8 serially connected between the sense amplifier bit line pair BLsa and BLBsa. The PMOS transistors P7 and P8 have a common source receiving the voltage from SAPRE, or an external power voltage, but preferably the first voltage Vcca. A gate of the PMOS transistor P7 is connected to the sense amplifier bit line BLBsa, and a gate of the PMOS transistor P8 is connected to the sense amplifier bit line BLsa. The NMOS sense amplifier 48 has NMOS transistors N27 and N28 serially connected between the sense amplifier bit line pair BLsa and BLBsa. The NMOS transistors N27 and N28 have a common source receiving a signal SAN. A gate of the NMOS transistor N27 is connected to the sense amplifier bit line BLBsa, and a gate of the NMOS transistor N28 is connected to the sense amplifier bit line BLsa. The bit line isolation circuit 42 includes NMOS transistors N25 and N26 connected between the cell bit line pair BLcelli and BLBcelli and the sense amplifier bit line pair BLsa and BLBsa, respectively. The bit line isolation circuit 50 includes NMOS transistors N29 and N30 connected between cell bit line pair BLcellj and BLBcellj and the sense amplifier bit line pair BLsa and BLBsa, respectively. Each of the memory cells MCi and MCJ includes an NMOS transistor NM having a gate connected to the word lines WLi and WLj and a drain connected to the cell bit line BLcelli and BLcellj, respectively, and a capacitor C connected between a source of the NMOS transistor NM and a ground voltage.

The NMOS transistors N22, N23, and N24 of the cell bit line pre-charge circuit 40 are turned on in response to the control signal BLPRE having a logic "high" level to pre-charge the cell bit line pair BLcelli and BLBcelli to a voltage Vcca/2. The NMOS transistors N25 and N26 of the bit line isolation circuit 42 are turned on in response to a control signal ISOi to transfer charges to, and electrically connect, the cell bit line pair BLcelli and BLBcelli to the sense amplifier bit line pair BLsa and BLBsa. The PMOS transistors P5 and P6 of the sense amplifier bit line pre-charge circuit 44 are turned on in response to the control signal SAPRE having a logic "low" level to pre-charge the sense amplifier bit line pair BLsa and BLBsa to a first voltage Vcca. The PMOS transistors P7 and P8 of the PMOS sense amplifier 46 are turned on in response to a signal of the sense amplifier bit line pair BLsa and BLBsa having a logic "low" level to amplify a signal of the cell bit line pair BLcelli and BLBcelli and the sense amplifier bit line pair BLsa and BLBsa having a logic "high" level to a first voltage Vcca. When a sense amplifier enable signal SAN of 0 volts is applied, the NMOS transistors N27 and N28 of the NMOS sense amplifier 48 are turned on in response to a signal of the sense amplifier bit line pair BLsa and BLBsa to amplify a signal of the cell bit line pair BLcellj and BLBcellj and the sense amplifier bit line pair BLsa and BLBsa having a logic "low" level to a second voltage of 0 volts. The NMOS transistors N29 and N30 of the bit line isolation circuit 50 are turned on in response to a control signal ISOj to transfer charges to, and electrically connect the cell bit line pair BLcellj and BLBcellj to the sense amplifier bit line pair BLsa and BLBsa.

In FIG. 5, the PMOS sense amplifier 46 is preferably configured to be directly connected to a first voltage Vcca. But, like the NMOS sense amplifier 48, the PMOS sense amplifier 46 may be configured such that a first voltage Vcca is applied to the common source of the PMOS transistors P7 and P8. In this case, when a sense amplifier enable signal having a first voltage level Vcca is applied, the PMOS transistors P7 and P8 are turned on in response to a signal of the sense amplifier bit line pair BLsa and BLBsa having a logic "low" level to amplify a signal of the cell bit line pair BLcelli and BLBcelli and the sense amplifier bit line pair BLsa and BLBsa having a logic "high" level to a first voltage Vcca.

Figure 6:
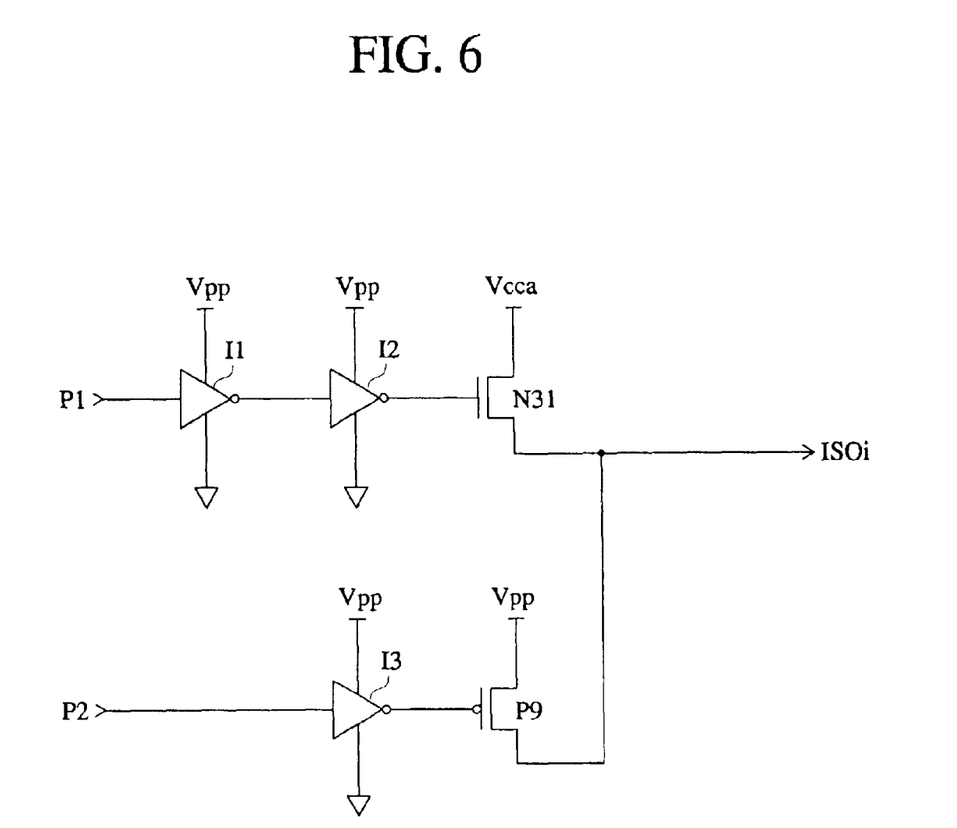
FIG. 6 illustrates a circuit diagram of a control signal generating circuit for generating a control signal ISOi shown in FIG. 5, according to the present invention.

FIG. 6 illustrates a circuit diagram of a control signal generating circuit for generating the control signal ISOi shown in FIG. 5 according to the present invention. The circuit of FIG. 6 preferably includes inverters I1 to I3, an NMOS transistor N31, and a PMOS transistor P9. The inverters I1 and I2 buffer a control signal P1 having a logic "high" level to generate a high third voltage Vpp. The inverter I3 inverts a control signal P2 having a logic "high" level to generate a second voltage 0V. The NMOS transistor N31 receives a first voltage Vcca to generate the control signal ISOi in response to an output signal of the inverter I2 having the high third voltage level Vpp. The PMOS transistor P9 receives a high third voltage Vpp to generate the control signal ISOi in response to an output signal of the inverter I3 having a ground voltage level (second voltage 0V).

Figure 7:
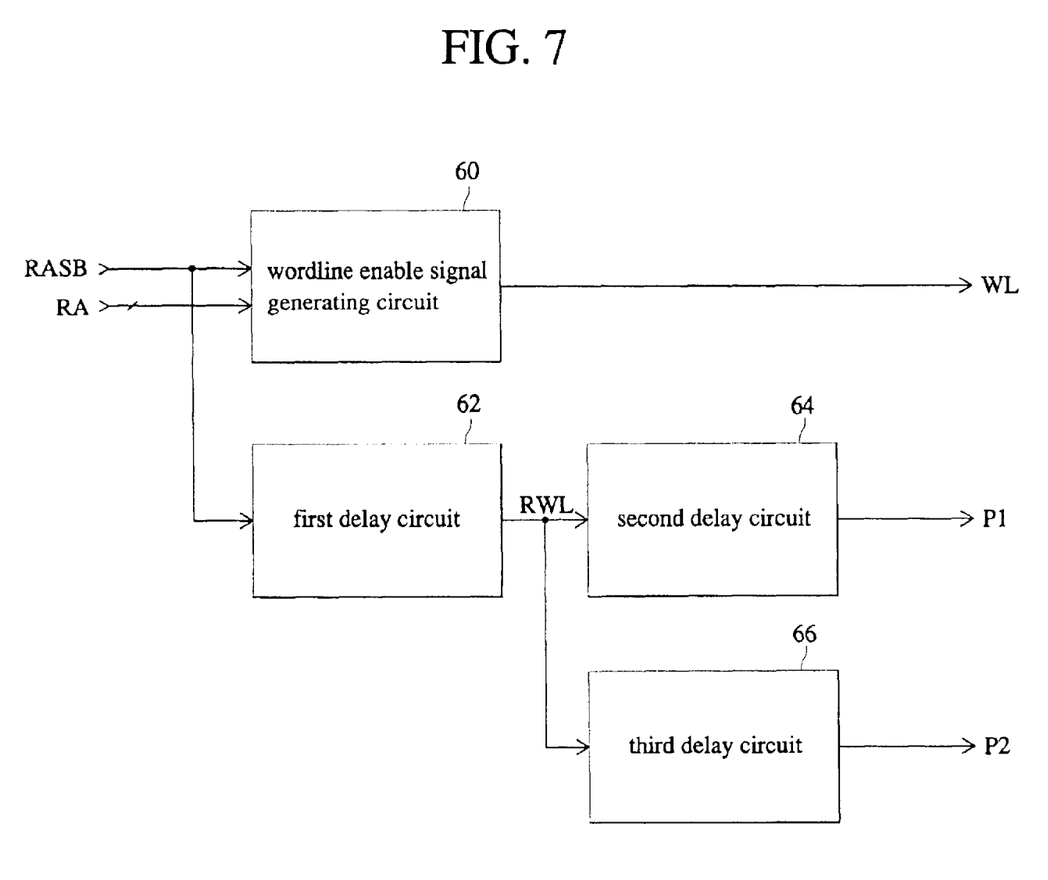
FIG. 7 illustrates a circuit diagram of a signal generating circuit for generating signals P1 and P2 shown in FIG. 6, according to the present invention.

FIG. 7 illustrates a circuit diagram of a signal generating circuit for generating the signals P1 and P2 shown in FIG. 6 according to the present invention. The signal generating circuit of FIG. 7 preferably includes a word line enable signal generating circuit 60, and first, second and third delay circuits 62, 64 and 66, respectively. The first delay circuit 62 is designed to have the same line load as the word line enable signal generating circuit 60. The word line enable signal generating circuit 60 incorporates a predetermined time delay after reception and decoding of a row address RA in response to an inverted row address strobe signal RASB before generating a word line enable signal WL.

The first delay circuit 62 generates a signal RWL in response to the inverted row address strobe signal RASB at the same time that the word line enable signal WL is generated. The second delay circuit 64 delays the signal RWL by a first predetermined time to generate the signal P1.

The third delay circuit 66 delays the signal RWL by a second predetermined time to generate the signal P2. Since the first delay circuit 62 preferably has a same configuration as the word line enable signal generating circuit 60, the signals RWL, P1 and P2 may be generated with accurate timing.

Figure 8:
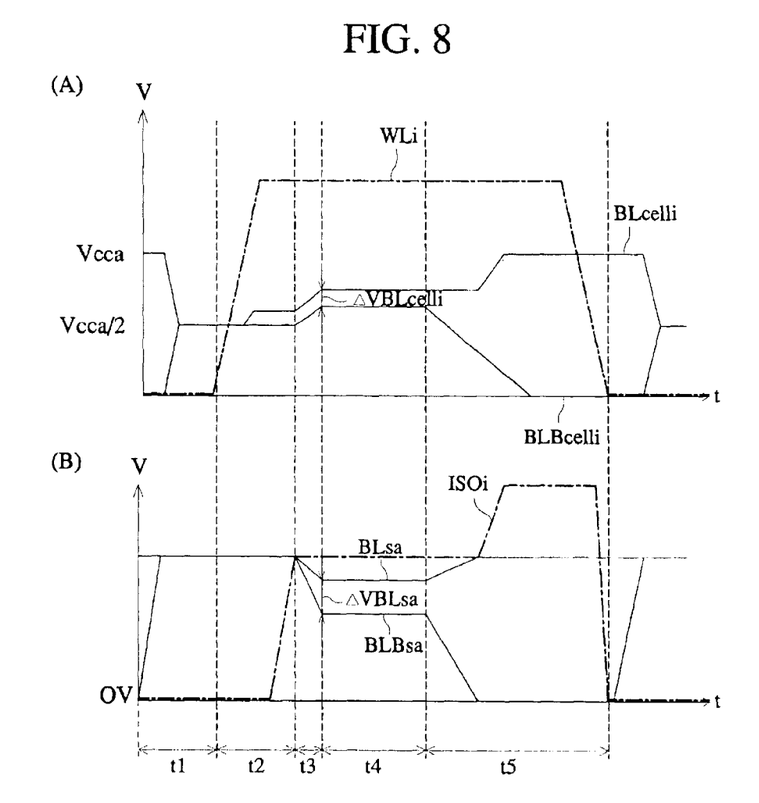
FIG. 8 illustrates timing diagrams (A) and (B), which illustrate an operation of the semiconductor memory device of FIG. 5.

Operation of the semiconductor memory device of FIG. 5 is described below with reference to FIG. 8, which illustrates timing diagrams (A) and (B), illustrating an operation of the semiconductor memory device of FIG. 5. In particular, (A) is a timing diagram to describe an operation of a cell bit line pair portion, and (B) is a timing diagram to describe an operation of a sense amplifier bit line pair. In FIG. 8, data is read from the memory cell array block BLK1.

During a time period t1, when the control signal ISOi is maintained at the second voltage of 0 volts, the control signal BLPRE having a logic "high" level, and the control signal SAPRE having a logic "low" level are applied, the NMOS transistors N25 and N26 are turned off. The NMOS transistors N22, N23 and N24 are turned on to pre-charge the cell bit line pair BLcelli and BLBcelli to a voltage Vcca/2. The PMOS transistors P5 and P6 are turned on to pre-charge the sense amplifier bit line pair BLsa and BLBsa to a first voltage Vcca.

During a time period t2, when a high voltage Vpp is applied to the word line WLi, the NMOS transistor NM of the memory cell MCi is turned on to perform a charge sharing operation between the capacitor C and the cell bit line pair BLcelli and BLBcelli. Thus, a voltage difference occurs between the cell bit line pair BLcelli and BLBcelli.

During a time period t3, when the control signal ISOi of a first voltage Vcca is applied, the NMOS transistors N25 and N26 are turned on, so that a charge transfer occurs between the cell bit line pair BLcelli and BLBcelli and the sense amplifier bit line pair BLsa and BLBsa, and a voltage of the cell bit line pair BLcelli and BLBcelli is steadily raised to cause a voltage difference ΔVBLcelli, and a voltage of the sense amplifier bit line pair BLsa and BLBsa is steadily lowered to cause ΔVBLsa.

During a time period t4, when a voltage difference between the cell bit line pair BLcelli and BLBcelli and the sense amplifier bit line pair BLsa and BLBsa is lower than a threshold voltage of the NMOS transistors N25 and N26, the NMOS transistors N25 and N26 are turned off. As a result, a connection between the cell bit line pair BLcelli and BLBcelli and the sense amplifier bit line pair BLsa and BLBsa is cut off, and charge transfer therebetween ceases. Consequently, the cell bit line pair BLcelli and BLBcelli and the sense amplifier bit line pair BLsa and BLBsa are maintained at a certain level.

During a time period t5, when the sense amplifier enable signal SAN of 0 volts is applied, the NMOS sense amplifier 46 and the PMOS sense amplifier 48 operate to amplify a voltage of the sense amplifier bit line pair BLsa and BLBsa to a voltage of 0 volts and a voltage Vcca, respectively. At this time, when the control signal ISOi is transited to a high third voltage level Vpp, the NMOS transistors N25 and N26 are turned on so that an amplified level of the sense amplifier bit line pair BLsa and BLBsa is transferred to the cell bit line pair BLcelli and BLBcelli. That is, during this time period, the cell bit line pair BLcelli and BLBcelli as well as the sense amplifier bit line pair BLsa and BLBsa is amplified.

The semiconductor memory device of the present invention is preferably configured to apply a voltage Vcca, which corresponds to an intermediate voltage level of the control signal ISOi, as a voltage for pre-charging the cell bit line pair BLcelli and BLBcelli and the sense amplifier bit line pair BLsa and BLBsa. However, the semiconductor memory device of the present invention may be configured to apply an external power voltage instead of the voltage Vcca.

As described above, the semiconductor memory device according to the present invention shares the PMOS sense amplifier and the NMOS sense amplifier between the memory cell array blocks to perform a charge transfer pre-sensing operation, and thus a layout area size can be significantly reduced. In addition, using the semiconductor memory device and the bit line sensing method according to the present invention, it is easier to control a level of the control signal applied to the bit line isolation circuit than by using conventional implementations.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor memory device, comprising:
   a memory cell connected between a cell bit line pair and a word line;
      a bit line pre-charge circuit connected to the cell bit line pair for pre-charging the cell bit line pair to a voltage lower than a first voltage in response to a cell bit line pre-charge control signal;
      a sense amplifier bit line pre-charge circuit connected to a sense amplifier bit line pair for pre-charging the sense amplifier bit line pair to the first voltage in response to a sense amplifier bit line pre-charge control signal;
      a charge transfer circuit connected between the cell bit line pair and the sense amplifier bit line pair for transferring charges to the cell bit line pair and the sense amplifier bit line pair in response to a control signal;
      a first sense amplifier circuit connected between the sense amplifier bit line pair for amplifying a voltage of a first bit line of the sense amplifier bit line pair to the first voltage; and
      a second sense amplifier circuit connected between the sense amplifier bit line pair for amplifying a voltage of a second bit line or the sense amplifier bit line pair to a second voltage in response to a sense amplifier enable signal.

2. The semiconductor memory device as claimed in claim 1, wherein the control signal is maintained at the second voltage, and is transited to the first voltage before the sense amplifier enable signal is generated after an active command is applied, and is transited from the first voltage to a third voltage after the sense amplifier enable signal is generated.

3. The semiconductor memory device as claimed in claim 2, wherein the control signal is generated by a signal generating circuit and a control signal generating circuit, the signal generating circuit comprising:
   a first delay circuit having a same line load as a word line enable signal for enabling the word line, and receiving and delaying the active command;
   a second delay circuit delaying an output signal of the first delay circuit by a first time to generate a first signal; and
   a third delay circuit delaying the output signal of the first delay circuit by a second time to generate a second signal;

wherein the control signal generating circuit generates the control signal having the first voltage in response to the first signal, and generates the control signal having the third voltage in response to the second signal.

4. The semiconductor memory device as claimed in claim 1, wherein the voltage lower than the first voltage is the first voltage/2.

5. The semiconductor memory device as claimed in claim 2, wherein the first voltage is an internal power voltage.

6. The semiconductor memory device as claimed in claim 2, wherein the first voltage is an external power voltage.

7. The semiconductor memory device as claimed in claim 2, wherein the second voltage is a ground voltage.

8. The semiconductor memory device as claimed in claim 2, wherein the third voltage is a high voltage higher than the power voltage.

9. The semiconductor memory device as claimed in claim 1, wherein the sense amplifier bit line pre-charge circuit comprises first and second PMOS transistors serially connected between the sense amplifier bit line pair and having a common source receiving the first voltage and a gate receiving the sense amplifier bit line pre-charge control signal.

10. The semiconductor memory device as claimed in claim 1, wherein the first sense amplifier circuit comprises third and fourth PMOS transistors serially connected between the sense amplifier bit line pair and having a gate connected to the sense amplifier bit line pair and a common source receiving the first voltage.

11. The semiconductor memory device as claimed in claim 1, wherein the first sense amplifier circuit includes third and fourth PMOS transistors serially connected between the sense amplifier bit line pair and having a gate connected to the sense amplifier bit line pair and a common source receiving the first voltage in response to the sense amplifier enable signal.

12. The semiconductor memory device as claimed in claim 1, wherein the second sense amplifier circuit comprises first and second NMOS transistors serially connected between the sense amplifier bit line pair and having a gate connected to the sense amplifier bit line pair and a common source receiving the second voltage in response to the sense amplifier enable signal.

13. A bit line sensing method of a semiconductor memory device, comprising;

separating a cell bit line pair from a sense amplifier bit line pair when a control signal of a second voltage is applied, pre-charging the cell bit line pair to a voltage lower than a first voltage, and pre-charging the sense amplifier bit line pair to the first voltage when a sense amplifier bit line pre-charge control signal is applied;

generating a first voltage difference between the cell bit line pair by enabling a word line and selecting a memory cell;

generating a second voltage difference between the cell bit line pair by connecting the cell bit line pair to the sense amplifier bit line pair when the control signal having the first voltage is applied, and generating a voltage difference between the sense amplifier bit line pair by reducing a voltage of the sense amplifier bit line pair;

maintaining a voltage of the cell bit line pair and the sense amplifier bit line pair at a certain voltage; and amplifying the sense amplifier bit line pair to the first voltage and the second voltage by enabling a PMOS sense amplifier and a NMOS sense amplifier, and transferring a voltage of the sense amplifier bit line pair to the cell bit line pair when the control signal having a third voltage higher than a power voltage is applied.

14. The method as claimed in claim 13, wherein the voltage lower than the first voltage is the first voltage/2.

15. The method as claimed in claim 13, wherein the first voltage is an internal power voltage.

16. The method as claimed in claim 13, wherein the first voltage is an external power voltage.

17. The method as claimed in claim 13, wherein the second voltage is a ground voltage.

* * * * *